United States Patent [19]

Hara

[11] Patent Number: 5,115,211

[45] Date of Patent: May 19, 1992

[54] PIEZO-ELECTRIC OSCILLATOR

[75] Inventor: Takaaki Hara, Tokyo, Japan

[73] Assignee: NEC Corporation, Japan

[21] Appl. No.: 737,464

[22] Filed: Jul. 29, 1991

[30] Foreign Application Priority Data

Jul. 27, 1990 [JP] Japan .................................. 2-197624

[51] Int. Cl.$^5$ .......................... H03B 5/36; H03B 5/06
[52] U.S. Cl. ............................... 331/116 FE; 331/158
[58] Field of Search .............. 331/74, 116 R, 116 FE, 331/117 R, 117 FE, 158, 182, 183, 185, DIG. 3

[56] References Cited

U.S. PATENT DOCUMENTS 4,117,421 9/1978 Wiesner ........................... 331/185 X
4,587,497 5/1986 Keller et al. ..................... 331/158 X Primary Examiner—David Mis
Attorney, Agent, or Firm—Laff, Whitesel, Conte & Saret

[57] ABSTRACT

A piezo-electric oscillator includes an oscillatory circuit including a piezo-electric resonator for generating an oscillatory signal, a buffer amplifying circuit for buffering and amplifying the oscillatory signal, the buffer amplifying circuit being connected serially with the oscillatory circuit, and a switching circuit for switching a power supply line. The switching circuit is connected in parallel with the buffer amplifying circuit and selectively short-circuits the buffer amplifying circuit in accordance with an output signal of the oscillatory circuit.

6 Claims, 4 Drawing Sheets

PIEZO-ELECTRIC OSCILLATOR

FIELD OF THE INVENTION

This invention relates to a piezo-electric oscillator, and more particularly to, a piezo-electric oscillator having a small size and a high stability oscillation performance.

BACKGROUND OF THE INVENTION

A piezo-electric oscillator is used in a mobile communication device such as a portable telephone or a pager because of its small size, high stability without adjusting, and economy of power consumption with using a rechargible battery as a power supply.

One type of a conventional piezo-electric oscillator includes an oscillatory circuit using a piezo-electric resonator and a buffer amplifying circuit for amplifying an output of the oscillatory circuit or buffering changes of a load connected serially with the oscillatory circuit. The oscillatory circuit includes a piezo-electric resonator such as a crystal resonator, an amplifying unit including N-type and P-type MOSFETs which together function as a voltage amplifier, a feedback unit including phase shifting capacitors for feedbacking some proportion of the amplified signal.

In operation, the piezo-electric resonator oscillates at a predetermined frequency to generate an oscillatory signal. The amplifying unit amplifies the oscillatory signal. The feedback unit feedbacks some proportion of the oscillatory signal thus amplified. The oscillatory signal is supplied through the capacitor to the buffer amplifying circuit. The buffer amplifying circuit amplifies the oscillatory signal to be supplied as an output signal to an external circuit.

According to the conventional piezo-electric oscillator, however, there is a disadvantage in that start-up of the oscillation thereof is difficult to be carried out in some cases. The reason thereof will be explained.

Now, amplification degree of the amplifying unit and feedback factor of the feedback unit are defined as $\mu$ and $\beta$, respectively. A product $\mu\beta$ should be larger than 1 to start-up the piezo-electric resonator to oscillate. However, the value of $\mu\beta$ depends on various factors.

First, the product $\mu\beta$ changes in accordance with a transfer conductance $g_m$ of the MOSFETs of the amplifying unit if an equivalent resistance CI of the piezo-electric resonator is constant. The product $\mu\beta$ becomes large as $g_m$ becomes large. However, the power consumption of the piezo-electric oscillator may increase if $g_m$ is set to be large.

Second, the product $\mu\beta$ depends on the equivalent resistance CI of the piezo-electric resonator. The feedback factor $\beta$ becomes small as the equivalent resistance CI becomes large. Therefore, the product $\mu\beta$ becomes small as the excitation level $I_Q$ becomes small. It is preferable for the equivalent resistance CI to change little in accordance with changes of an excitation level $I_Q$ which is an amount of current flowing through the piezo-electric resonator, because the change of the equivalent resistance CI may cause instability of characteristics of the piezo-electric oscillator such as a temperature characteristic. In practice, however, the equivalent resistance CI depends on physical design thereof and becomes large as the excitation level $I_Q$ becomes small. In other words, the equivalent resistance CI is large at the start-up of the oscillation of the piezo-electric resonator when $I_Q$ is nearly zero.

If capacities of the phase shifting capacitors and the transfer conductance $g_m$ of the MOSFETs are determined so that the product $\mu\beta$ has an adequate value (larger than 1) when the equivalent resistance CI is in stationary state, the product $\mu\beta$ is smaller than 1 at the start of oscillation. In the stationary state, the growth of amplitude of the oscillation saturates ($\mu\beta = 1$), and the excitation level $I_Q$ has a value where the gain of the amplifying unit 14 and the loss of the feedback unit are balanced. Though the product $\mu\beta$ becomes larger than 1 if the excitation level $I_Q$ is significantly large, there are some disadvantages such as deterioration of aging characteristic of the piezo-electric resonator or increase of the power consumption thereof.

The feedback factor $\beta$ becomes large as capacitance of the phase shifting capacitors becomes small, so that the product $\mu\beta$ becomes large as capacitance of the phase shifting capacitors becomes small. However, sensitivity of operation point of the piezo-electric resonator becomes high as the capacitance of the phase shifting capacitors become small, so that frequency stability of the piezo-electric resonator deteriorates.

Thus, the conventional piezo-electric oscillator may be difficult to oscillate because of a small value of $\mu\beta$ if a piezo-electric resonator having a characteristic in which an equivalent resistance CI is high at start-up of oscillation thereof.

SUMMARY OF THE INVENTION

Accordingly, it is an object of the invention to provide a piezo-electric oscillator which oscillates without faults even if a piezo-electric resonator having a characteristic in which an equivalent resistance is high at start-up of oscillation thereof is used therefor.

According to a feature of the invention, a piezo-electric oscillator comprises an oscillatory circuit including a piezo-electric resonator for generating an oscillatory signal.

A buffer amplifying circuit for buffering and amplifying the oscillatory signal, the buffer amplifying circuit being connected serially with the oscillatory circuit.

A switching circuit for switching a power supply line, the switching circuit being connected in parallel with the buffer amplifying circuit and selectively short-circuiting the buffer amplifying circuit in accordance with an output signal of the oscillatory circuit.

BRIEF DESCRIPTION OF THE DRAWINGS

The invention will be explained in more detail in conjuction with appended drawings wherein.

DESCRIPTION OF THE PREFERRED EMBODIMENTS

Before describing a piezo-electric oscillator in a preferred embodiment according to the invention, the conventional piezo-electric oscillator described before will be explained in conjuction with FIGS. 1 to 5.

Figure 1:
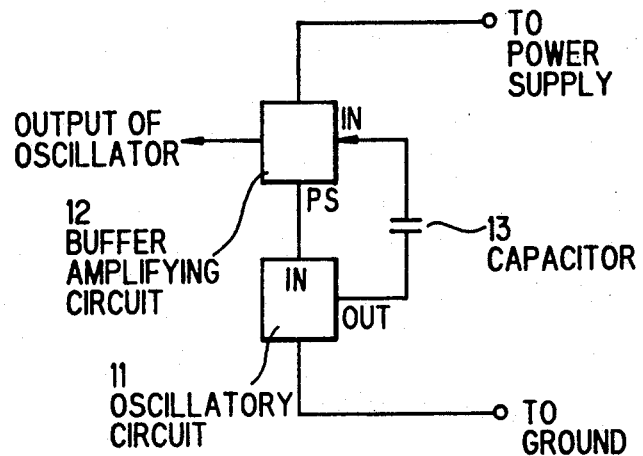
FIG. 1 is a block diagram of a conventional piezo-electric oscillator.

As shown in FIG. 1, the conventional piezo-electric oscillator includes an oscillatory circuit 11, a buffer amplifying circuit 12 connected serially with the oscillatory circuit 11, and a capacitor 13 connected between an output of the oscillatory circuit 11 and an input of the buffer amplifying circuit 12.

Figure 2:
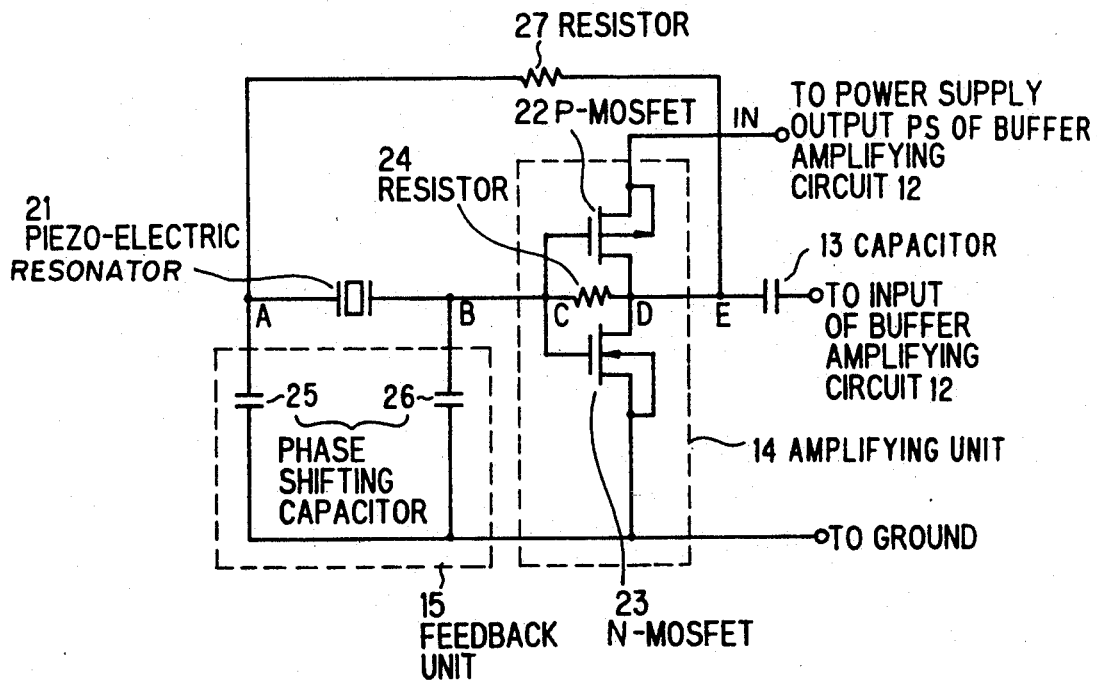
FIG. 2 is a circuitry diagram of an oscillatory circuit of the conventional piezo-electric oscillator in FIG. 1.

In FIG. 2, the oscillatory circuit 11 includes a piezo-electric resonator 21 such as crystal resonator, an amplifying unit 14 including P-type and N-type MOSFETs 22 and 23 which together function as a voltage amplifier to shift the phase of an oscillatory signal generated by the piezo-electric resonator 21 by 180° and a resistor 24 which determines an operation voltage of the piezo-electric oscillator 21, a feedback unit 15 including phase shifting capacitors 25 and 26 which shift the phase of the oscillatory signal by 90°, and a resistor 27.

The piezo-electric resonator 21 is connected at two terminals to nodal points A and B, respectively. The P-MOSFET 22 is connected at a gate to a nodal point C which is connected to the nodal point B, at a source to a power supply output PS of the buffer amplifying circuit 12, and at a drain to a nodal point D. The N-MOSFET 23 is connected at a gate to the nodal point C, at a source to ground, and at a drain to the nodal point E which is connected to both the nodal point D and one terminal of the capacitor 13. The resistor 24 is connected between the nodal points C and D. The phase shifting capacitors 25 and 26 are connected at first terminals to two terminals of the piezo-electric resonator 21, respectively, and at second terminals to ground commonly. The resistor 27 is connected between the nodal points A and E.

In operation, the piezo-electric resonator 21 oscillates at a predetermined frequency to generate an oscillatory signal. The amplifying unit 14 amplifies the oscillatory signal. The feedback unit 15 feedbacks some proportion of the oscillatory signal thus amplified. The oscillatory signal is supplied through the capacitor 13 to the buffer amplifying circuit 12. The buffer amplifying circuit 12 amplifies the oscillatory signal and supplies as an output signal of the piezo-electric oscillator to an external circuit.

As explained before, a product $\mu\beta$ should be larger than 1 to start-up the piezo-electric resonator 21 to oscillate, however, the value of $\mu\beta$ depends on various factors.

Figure 3:
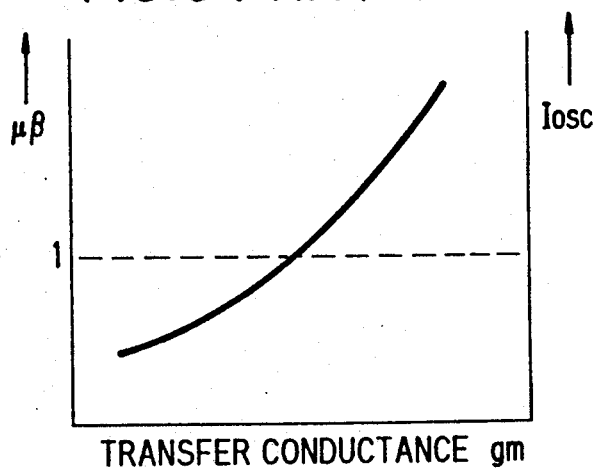
FIG. 3 is a graph showing a relation between a transfer conductance gm and a value of $\mu\beta$ in the conventional piezo-electric oscillator.

As shown in FIG. 3, the product $\mu\beta$ becomes large as a transfer conductance $g_m$ of the MOSFETs 22 and 23 becomes large if an equivalent resistance CI of the piezo-electric resonator 21 is constant. However, the power consumption of the oscillator may increase if $g_m$ is set to be large.

Figure 4:
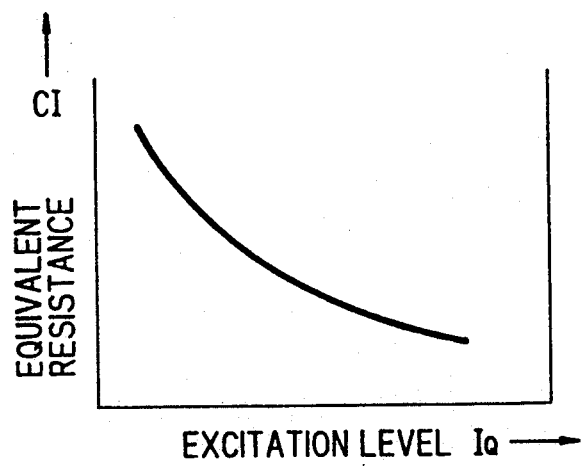
FIG. 4 is a graph showing a relation between an excitation level $I_Q$ and an equivalent resistance CI in the conventional piezo-electric oscillator.

As shown in FIG. 4, the equivalent resistance CI depends on physical design and becomes large as the excitation level $I_Q$ becomes small, and the product $\mu\beta$ depends on the equivalent resistance CI of the piezo-electric resonator 21. In other words, the equivalent resistance CI is large at the start of oscillation of the piezo-electric resonator 21 when $I_Q$ is nearly zero.

Figure 5:
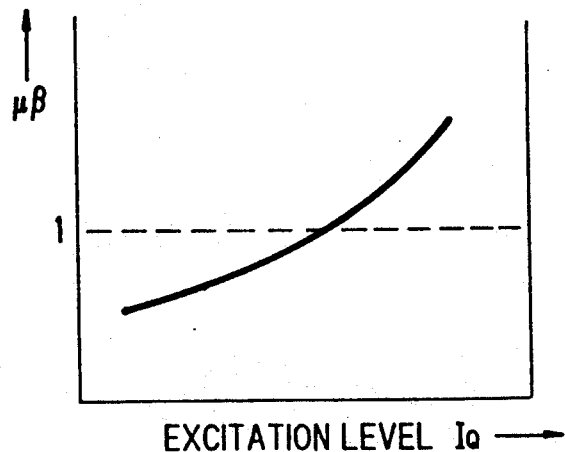
FIG. 5 is a graph showing a relation between an excitation level $I_Q$ and a value of $\mu\beta$ in the conventional piezo-electric oscillator.

The feedback factor $\beta$ becomes small as the equivalent resistance CI becomes large. Therefore, the product $\mu\beta$ becomes small as the excitation level $I_Q$ becomes small, as shown in FIG. 5. If capacities of the phase shifting capacitors 25 and 26 and the transfer conductance $g_m$ of the MOSFETs 22 and 23 are determined so as that the product $\mu\beta$ has an adequate value (larger than 1) when the equivalent resistance CI is in stationary state, the product $\mu\beta$ is smaller than 1 at the start of oscillation.

Next, a piezo-electric oscillator in a preferred embodiment according to the invention will be explained in conjuction with FIGS. 6 to 8.

Figure 6:
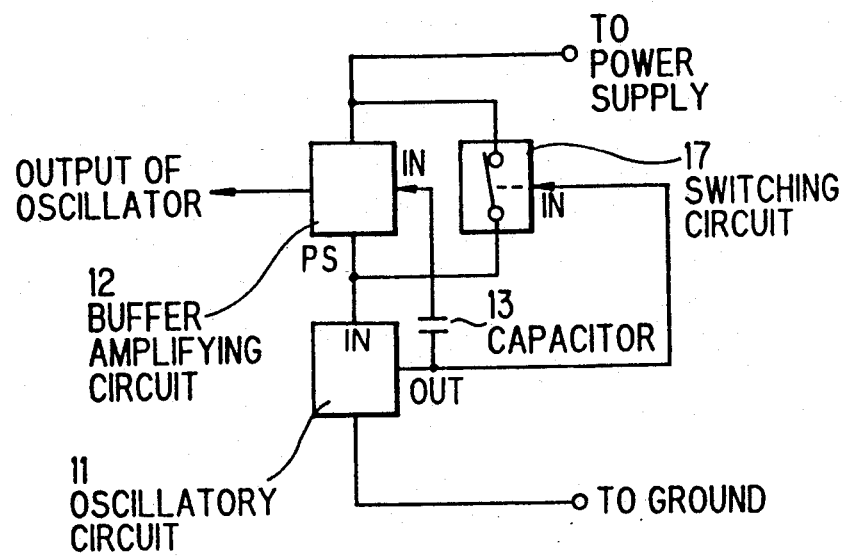
FIG. 6 is a block diagram of a piezo-electric oscillator in a preferred embodiment according to the invention.

As shown in FIG. 6, the circuitry structure of the piezo-electric oscillator is the same as that in FIG. 1, except that there is further provided with a switching circuit 17 connected in parallel with the buffer amplifying circuit 12. The switching circuit 17 short-circuits the buffer amplifying circuit 12 in accordance with an output signal of the oscillatory circuit 11.

Figure 7:
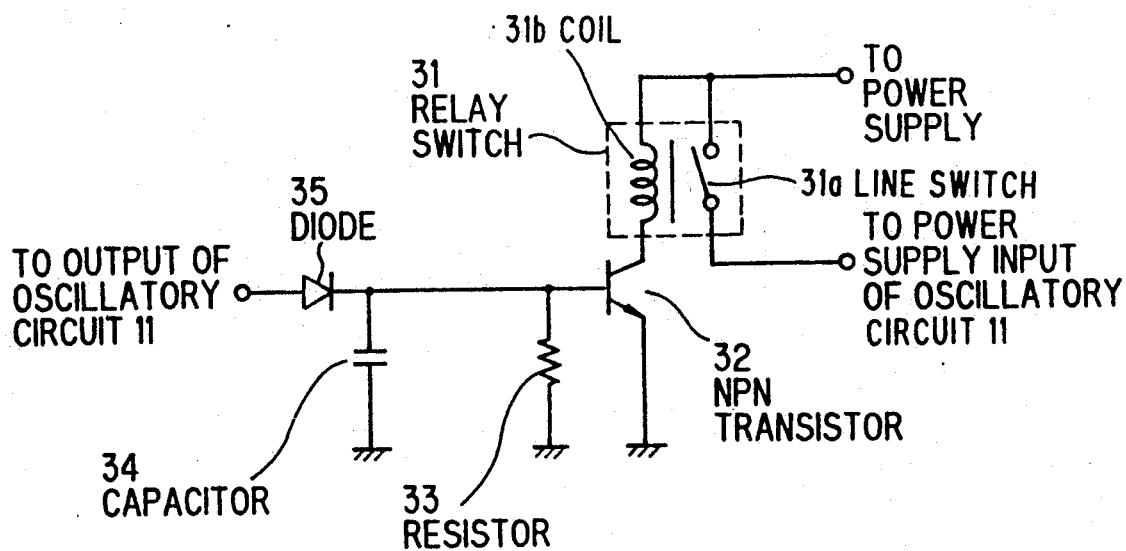
FIG. 7 is a circuitry diagram of a switching circuit of the piezo-electric oscillator in FIG. 6.
Figure 8:
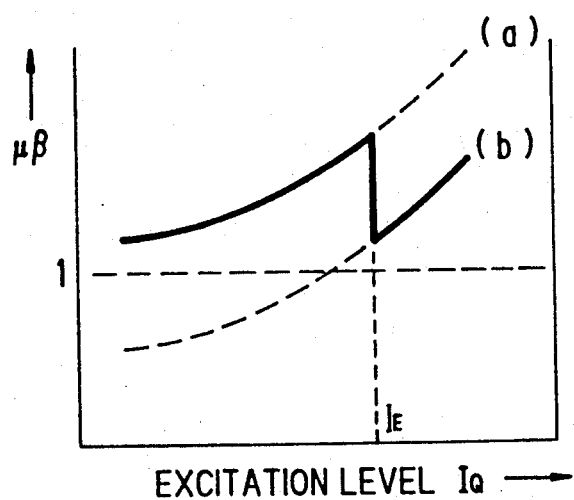
FIG. 8 is a graph showing a relation between an excitation level $I_Q$ and a value of $\mu\beta$ in the piezo-electric oscillator in the preferred embodiment according to the invention.

FIG. 7 is a circuitry diagram of the switching circuit 17. The switching circuit 17 includes a relay switch 31, an NPN transistor 32, a resistor 33, a capacitor 34 and a diode 35. In the relay switch 31, a line switch 31a is connected between a power supply and a power supply input IN of the oscillatory circuit 11, while a coil 31b is connected between a power supply and a collector of the NPN transistor 32. The NPN transistor 32 is connected at a base to a positive terminal of the diode 35 and at an emitter to ground. The resistor 33 and the capacitor 34 are both connected between the base of the NPN transistor 32 and ground. The diode 35 is connected at a negative terminal to an output of the oscillatory circuit 11.

In operation, when the oscillation of the piezo-electric resonator starts, the oscillatory circuit 11 does not supply a current to the base of the NPN transitor 32 of the switching circuit 17 to make current flow through the coil 31b of the relay switch 31 and the line switch 31a thereof remains connected, so that the buffer amplifying circuit 12 is short-circuited and a power supply current is supplied directly to the MOSFETs 22 and 23 of the oscillatory circuit 11 with relatively high voltages.

The output of the oscillatory circuit 11 is supplied through the capacitor 13 to the buffer amplifying circuit 12 where the output thereof is amplified to be supplied to an external circuit. In such a state, the product $\mu\beta$ has a relatively large value corresponding to a solid line portion of a curve (a) in FIG. 8.

When the oscillation of the piezo-electric resonator 21 of the oscillatory circuit 11 becomes stationary state at the excitation level $I_Q$ of $I_E$, a predetermined amount of a current is supplied to the base of the NPN transistor 32 and a predetermined amount of a current flows through the coil 31b of the relay switch 31 to cut off the line switch 31a, so that a power supply current is supplied to the oscillatory circuit 11 through the buffer amplifying circuit 12. Consequently, the MOSFETs 22 and 23 of the oscillatory circuit 11 are driven by relatively low voltages, so that the product $\mu\beta$ has a relatively small value corresponding to a solid line portion of a curve (b) in FIG. 8.

Thus, in the preferred embodiment, the product $\mu\beta$ has a relatively large value when the beginning of the oscillation thereof and a relatively small value when the oscillation becomes stationary state, so that it is possible to start-up the oscillation of the piezo-electric oscillator smoothly even if a piezo-electric resonator having the characteristic in which the equivalent resistance thereof is large at the start-up state as shown in FIG. 4 is used therein.

Although the invention has been described with respect to specific embodiment for complete and clear disclosure, the appended claims are not to thus limited and alternative constructions that may occur to one skilled in the art which fairly fall within the basic teaching herein set forth.

What is claimed is:

1. A piezo-electric oscillator, comprising:
   oscillatory means including a piezo-electric resonator for generating an oscillatory signal;
   buffer amplifying means for buffering and amplifying said oscillatory signal, said buffer amplifying means being connected serially with said oscillatory means; and
   switching means for switching a power supply line, said switching means being connected in parallel with said buffer amplifying means and selectively short-circuiting said buffer amplifying means in accordance with an output signal of said oscillatory means.

2. A piezo-electric oscillator, according to claim 1:
   wherein said switching means maintains said power supply line to be cut off when a level of said output signal is lower than a predetermined level and short-circuits said buffer amplifying means when a level of said output signal becomes higher than said predetermined level.

3. A piezo-electric oscillator, according to claim 1:
   wherein said switching means comprises a relay switch, an NPN transistor and a diode; and
   said output signal of said oscillatory means is supplied to a base of said NPN transistor through said diode to flow a predetermined level of current which enables said relay switch to short-circuit said buffer amplifying means.

4. A piezo-electric oscillator, according to claim 1:
   wherein said oscillatory means includes a piezo-electric resonator, an amplifying unit for amplifying an oscillatory signal generated by said piezo-electric resonator and a feedback unit for feedbacking a predetermined proportion of said oscillatory signal.

5. A piezo-electric oscillator, according to claim 4:
   wherein said amplifying unit comprises an N-MOSFET and a P-MOSFET together functioning as a voltage amplifier; and
   said feedback unit comprises two capacitors connected in parallel.

6. A piezo-electric oscillator, according to claim 1:
   wherein said piezo-electric resonator is a crystal resonator.

* * * * *